(12) United States Patent
Jeon

(10) Patent No.: US 9,735,332 B2
(45) Date of Patent: Aug. 15, 2017

(54) THERMOELECTRIC POWER GENERATION SYSTEM FOR VEHICLE

(71) Applicant: Hyundai Motor Company, Seoul (KR)

(72) Inventor: Kyung Beom Jeon, Jeollabuk-do (KR)

(73) Assignee: Hyundai Motor Company, Seoul (KR)

( * ) Notice: Subject to any disclaimer, the term of this patent is extended or adjusted under 35 U.S.C. 154(b) by 226 days.

(21) Appl. No.: 14/685,708

(22) Filed: Apr. 14, 2015

(65) Prior Publication Data
US 2016/0155921 A1  Jun. 2, 2016

(30) Foreign Application Priority Data

Dec. 2, 2014 (KR) .................. 10-2014-0170131

(51) Int. Cl.
| | | |
|---|---|---|
| H02J 7/00 | (2006.01) | |
| H01L 35/30 | (2006.01) | |
| H01M 10/46 | (2006.01) | |
| B60L 11/18 | (2006.01) | |
| H02J 7/35 | (2006.01) | |
| F25B 9/04 | (2006.01) | |
| F25B 21/02 | (2006.01) | |

(52) U.S. Cl.
CPC .......... *H01L 35/30* (2013.01); *B60L 11/1816* (2013.01); *B60L 11/1861* (2013.01); *F25B 9/04* (2013.01); *H01M 10/46* (2013.01); *H02J 7/35* (2013.01); *F25B 21/02* (2013.01)

(58) Field of Classification Search
CPC ...... H01L 35/28; H01L 35/30; B60L 11/1816; B60L 11/1861; H01M 10/46; F25B 21/02; F25B 9/04

USPC ............................................ 320/101; 136/205
See application file for complete search history.

(56) References Cited

U.S. PATENT DOCUMENTS

| | | | | |
|---|---|---|---|---|
| 3,691,408 A | * | 9/1972 | Rosso ............... | H01L 35/30 136/209 |
| 2008/0029624 A1 | * | 2/2008 | Shkolnikov ........ | B05B 5/10 239/690 |
| 2008/0179039 A1 | * | 7/2008 | Moilala ............. | F24F 5/0017 165/4 |
| 2010/0070090 A1 | * | 3/2010 | Mirpourian ....... | F24F 5/0085 700/278 |

(Continued)

FOREIGN PATENT DOCUMENTS

| | | |
|---|---|---|
| JP | 2011-109798 A | 6/2011 |
| KR | 2011-0064978 A | 6/2011 |

(Continued)

*Primary Examiner* — Nathaniel Pelton
(74) *Attorney, Agent, or Firm* — Mintz Levin Cohn Ferris Glovsky & Popeo, P.C.; Peter F. Corless

(57) ABSTRACT

A thermoelectric power generation system for a vehicle is provided. The system includes an air compressor that is configured to compress and discharge air and a vortex tube that is configured to receive the compressed air discharged from the air compressor and separate and discharge the compressed air into two groups of air having a temperature difference. In addition, a thermoelectric module is provided that includes a thermoelectric element having a channel formed at a first side thereof introduced with any one of the two groups of air and a channel formed at a second side thereof introduced with the other of the two groups of air to generate an electromotive force due to a temperature difference of the two groups of air.

4 Claims, 5 Drawing Sheets

(56) References Cited

U.S. PATENT DOCUMENTS

2015/0333244 A1* 11/2015 Iriyama .................. F01N 3/043
136/212
2016/0155922 A1* 6/2016 Lang ....................... H01L 35/32
320/162

FOREIGN PATENT DOCUMENTS

| KR | 10-2012-0008896 A | 2/2012 |
| KR | 10-2012-0114603 A | 10/2012 |
| KR | 2013-0096410 A | 8/2013 |

* cited by examiner

THERMOELECTRIC POWER GENERATION SYSTEM FOR VEHICLE

CROSS REFERENCE TO RELATED APPLICATION

The present application claims priority to Korean Patent Application No. 10-2014-0170131, filed Dec. 2, 2014, the entire contents of which is incorporated herein for all purposes by this reference.

BACKGROUND

1. Technical Field

The present invention relates to a thermoelectric power generation system for a vehicle, and more particularly, to a thermoelectric power generation system for a vehicle that generates a temperature difference in a thermoelectric element using a vortex tube.

2. Description of the Related Art

A thermoelectric element is collectively known as an element that uses various effects generated by an interaction of heat and electricity. As the thermoelectric effect, there are a thermistor which is an element having a characteristic of a negative temperature coefficient in which electric resistance is reduced in proportion to an increase in temperature, an element using a Seebeck effect which is a phenomenon of generating an electromotive force due to a temperature difference, an element using a Peltier effect which is a phenomenon of generating absorption (or generation) of heat due to a current, and the like.

The Seebeck effect is one of the thermoelectric phenomena in which a current flows in a closed circuit which connects two metals or semiconductor when a temperature difference is generated between the two metals or the semiconductor. These phenomena will be described in more detail below.

When a temperature difference is given to both tips (e.g., both ends) A and B of one metal rod, an electromotive force based on a heat flow is generated between the A and B (e.g., is generated between each end of the metal rod). Since the electromotive force is different based on a metal type, when both tips A and B of two different metal types are bonded, a difference in electromotive force between both tips A and B of each metal is generated and thus a current flows in a circuit. When a middle section of a metal is cut, the difference in electromotive force of the two metal types appears at both cut tips. This is referred to as a thermoelectromotive force.

A thermoelectric couple used for temperature measurement uses the thermoelectromotive force. Thermoelectric power generation using the thermoelectromotive force uses the Seebeck effect in which when a temperature difference is given to both tips of a Seebeck element which is metal or semiconductor, a potential difference is generated between a heat source unit and a cooling unit and may directly convert heat into electricity without a mechanical driving unit. The thermoelectric power generation has energy generation efficiency which is proportional to the temperature difference between the heat source unit and the cooling unit, and therefore may not have substantially high energy generation efficiency when the temperature difference therebetween is minimal and may require separate energy for forming a condition in which the temperature difference is substantial.

SUMMARY

An object of the present invention is to provide a thermoelectric power generation system for a vehicle capable of generating an electromotive force of a thermoelectric element using compressed air and a vortex tube which are conventionally used in other parts.

According to an exemplary embodiment of the present invention, a thermoelectric power generation system for a vehicle may include: an air compressor configured to compress and discharge air; a vortex tube configured to receive the compressed air discharged from the air compressor and separate and discharge the compressed air into two groups of air having a temperature difference (e.g., two groups having different temperatures); and a thermoelectric module configured to include a thermoelectric element having a channel formed at a first side thereof introduced with any one of the two groups (e.g., a first group) of air and a channel formed at a second side thereof introduced with the other of the two groups (e.g., a second group) of air to generate an electromotive force due to a temperature difference of the two groups (e.g., the first and the second group) of air.

The thermoelectric power generation system for a vehicle may further include: a valve disposed between the air compressor and the vortex tube. The thermoelectric power generation system for a vehicle may further include: a controller configured to operate an opening of the valve to adjust a compressed air quantity which is introduced from the air compressor into the vortex tube.

The controller may further be configured to receive information regarding a pressure and the compressed air quantity from the air compressor. The controller may then be configured to adjust an operational amount and an operational time of the valve. Additionally, the thermoelectric power generation system for a vehicle may further include: a battery configured to be connected to the thermoelectric element to store the electromotive force generated from the thermoelectric element and a muffler configured to be connected to the thermoelectric module to accommodate air discharged from the channels to attenuate noise and discharge the attenuated noise to the exterior.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Figure 1:
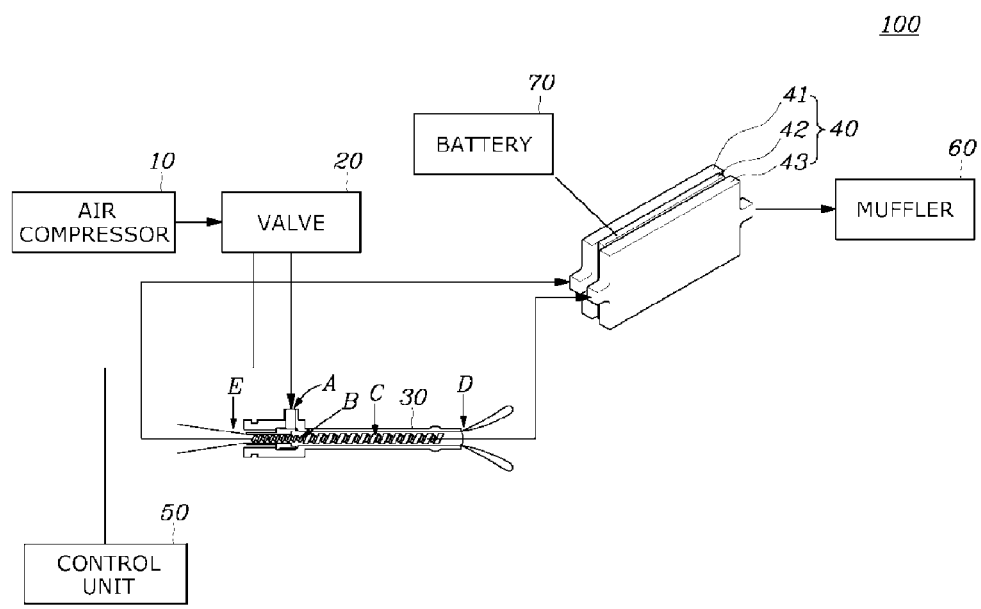
FIG. 1 is an exemplary diagram illustrating a thermoelectric power generation system for a vehicle according to an exemplary embodiment of the present invention.

Specific structural and functional descriptions will be provided to describe various exemplary embodiments of the present invention disclosed in the present specification or disclosure. Therefore, exemplary embodiments of the present invention may be implemented in various forms, and the present invention is not to be interpreted as being limited to exemplary embodiments described in the present specification or disclosure.

Since exemplary embodiments of the present invention may be various modified and may have several forms, specific exemplary embodiments will be shown in the accompanying drawings and will be described in detail in the present specification or disclosure. However, it is to be understood that the present invention is not limited to specific exemplary embodiments, but includes all modifications, equivalents, and substitutions included in the spirit and the scope of the present invention.

Terms such as 'first', and/or 'second', etc., may be used to describe various components, but the components are not to be construed as being limited to the terms. The terms are used only to distinguish one component from another component. For example, the 'first' component may be named the 'second' component and the 'second' component may also be similarly named the 'first' component, without departing from the scope of the present invention.

It is to be understood that when one component is referred to as being "connected to" or "coupled to" another element, it may be connected directly to or coupled directly to another element or be connected to or coupled to another element, having the other element intervening therebetween. On the other hand, it is to be understood that when one element is referred to as being "connected directly to" or "coupled directly to" another element, it may be connected to or coupled to another element without the other element intervening therebetween. Other expressions describing a relationship between components, that is, "between", "directly between", or "neighboring to", "directly neighboring to" and the like, should be similarly interpreted.

Terms used in the present specification are used only in order to describe specific exemplary embodiments rather than limiting the present invention. Singular forms are intended to include plural forms unless the context clearly indicates otherwise. It will be further understood that the terms "comprises" or "have" used in this specification, specify the presence of stated features, numerals, steps, operations, components, parts, or a combination thereof, but do not preclude the presence or addition of one or more other features, numerals, steps, operations, components, parts, or a combination thereof.

Unless indicated otherwise, it is to be understood that all the terms used in the specification including technical or scientific terms have the same meaning as those that are understood by those who skilled in the art. It must be understood that the terms defined by the dictionary are identical with the meanings within the context of the related art, and they should not be ideally or excessively formally defined unless the context in this specification clearly indicates otherwise.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g. fuels derived from resources other than petroleum).

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Hereinafter, exemplary embodiments of the present invention will be described in detail with reference to the accompanying drawings. Like reference numerals proposed in each drawing denote like components.

Figure 2:
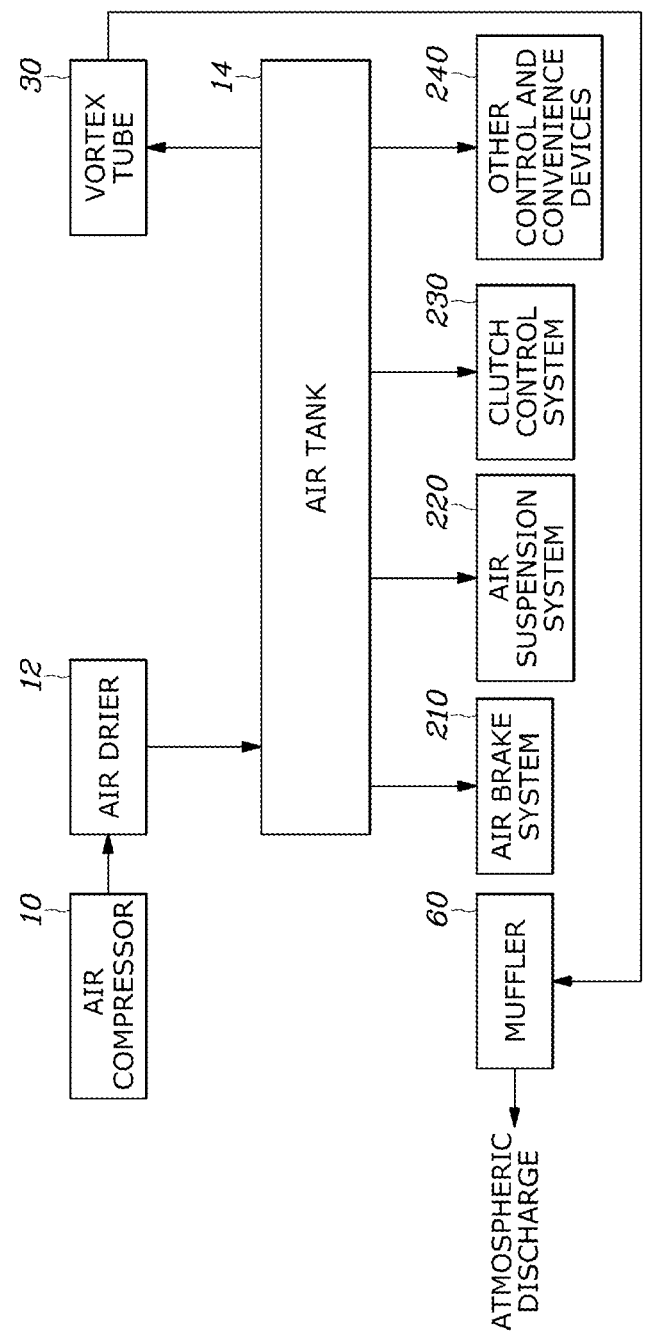
FIG. 2 is an exemplary flow chart of compressed air in the thermoelectric power generation system for a vehicle according to the exemplary embodiment of the present invention.
Figure 3:
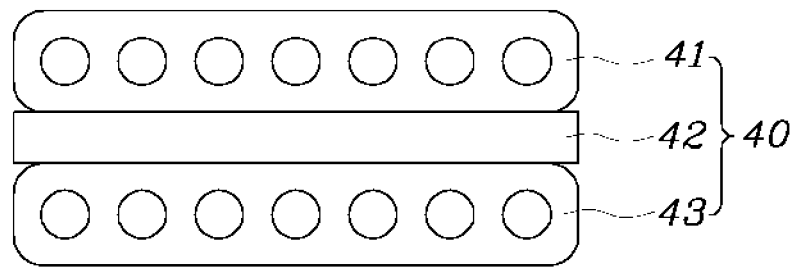
FIG. 3 is an exemplary cross-sectional view of a thermoelectric module according to an exemplary embodiment of the present invention.
Figure 4:
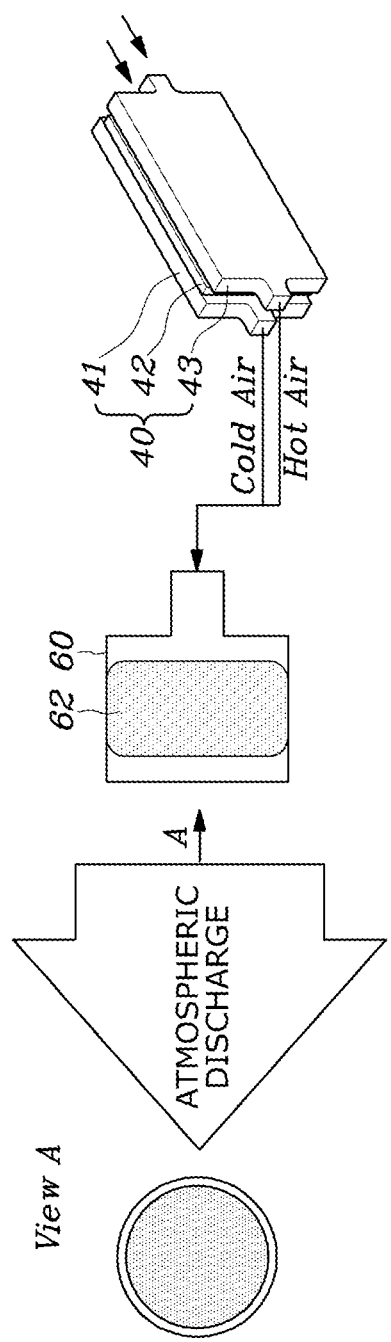
FIG. 4 is an exemplary diagram schematically illustrating a flow of air discharged from the thermoelectric power generation system for a vehicle according to the exemplary embodiment of the present invention.
Figure 5:
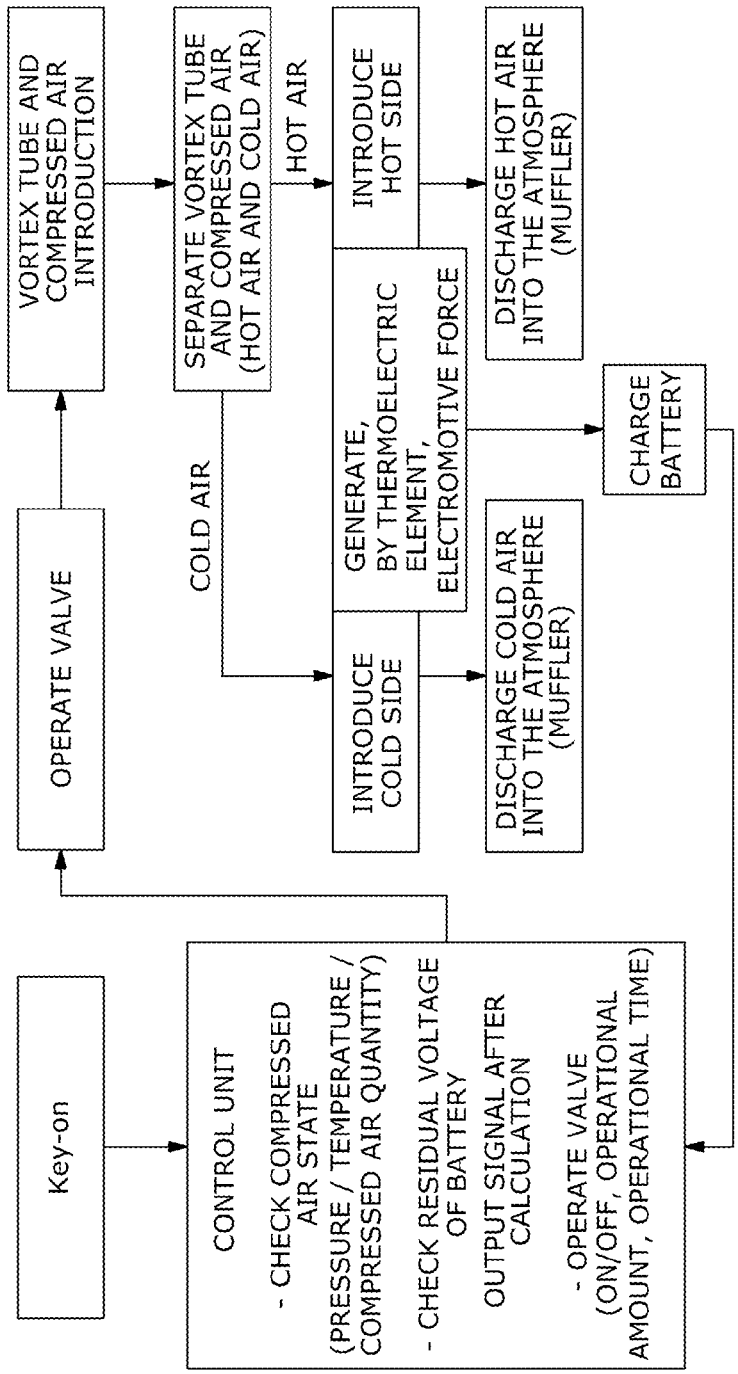
FIG. 5 is an exemplary diagram schematically illustrating a thermoelectric power generation process in the thermoelectric power generation system for a vehicle according to the exemplary embodiment of the present invention.

FIG. 1 is an exemplary diagram illustrating a thermoelectric power generation system for a vehicle according to an exemplary embodiment of the present invention. FIG. 2 is an exemplary flow chart of compressed air in the thermoelectric power generation system for a vehicle according to the exemplary embodiment of the present invention. FIG. 3 is an exemplary cross-sectional view of a thermoelectric module according to an exemplary embodiment of the present invention. FIG. 4 is an exemplary diagram schematically illustrating a flow of air discharged from the thermoelectric power generation system for a vehicle according to the exemplary embodiment of the present invention. FIG. 5 is an exemplary diagram schematically illustrating a thermoelectric power generation process in the thermoelectric power generation system for a vehicle according to the exemplary embodiment of the present invention.

Referring to FIGS. 1 to 4, a thermoelectric power generation system 100 for a vehicle according to an exemplary embodiment of the present invention may include an air compressor 10 configured to compress and discharge air, a vortex tube 30 configured to receive the compressed air discharged from the air compressor and separate and discharge the compressed air into two groups (e.g., a first group and a second group) of air having a temperature difference, a thermoelectric module 40 configured to include a thermoelectric element 42 having a channel 41 formed at a first side thereof introduced with any one of the two groups (e.g., the first group) of air and a channel 43 formed at a second side thereof introduced with the other of the two groups (e.g., the second group) of air to generate an electromotive force due to a temperature difference of the two groups of air, a valve 20 disposed between the air compressor 10 and the vortex tube 30, a controller 50 configured to operate an opening of the valve 20 to adjust an amount of a compressed air introduced from the air compressor 10 into the vortex tube 30, a battery 70 configured to be connected to the thermoelectric element 42 to store an electromotive force generated from the thermoelectric element 42, and a muffler 60 configured to be connected to the thermoelectric module 40 to accommodate the air discharged from the channels 41 and 43 to attenuate noise and discharge the attenuated noise to the outside. Notably, the channels may each be introduced with either the first or second group and are not limited to receiving a particular one of the two groups.

In particular, the air compressed by the air compressor 10 may be stored in an air tank 14 via an air drier 12. The compressed air stored in the air tank 14 may be supplied to an air brake system 210, an air suspension system 220, a clutch control system 230, other control and convenience devices 240, and the vortex tube 30. In other words, power generation of the thermoelectric element may be induced by introducing the compressed air used in the existing systems 210, 220, 230, and 240 mounted within a vehicle into the vortex tube 30 and using cold air and hot air which are discharged from the vortex tube 30. Therefore, it may be implemented by additionally forming a channel between the existing air tank 14 and vortex tube 30.

The valve 20, the vortex tube 30, and the thermoelectric module 40 may be positioned within the vehicle (e.g., at any location within the vehicle), and when the valve 20, the vortex tube 30, and the thermoelectric module 40 are positioned around the air tank 14, it may be possible to minimize the channel for the supplied compressed air. Alternatively, when the valve 20, the vortex tube 30, and the thermoelectric module 40 are positioned around the battery 70, it may be possible to minimize the usage of the battery charging cable. For example, when a vehicle is a truck, the valve 20, the vortex tube 30, and the thermoelectric module 40 may be positioned around the air tank 14 which is integrally formed with the battery 70 and when a vehicle is a bus, the valve 20, the vortex tube 30, and the thermoelectric module 40 may be positioned around the battery 70.

An operation of the vortex tube 30 illustrated in detail in FIG. 1 is as follows. When the compressed air is supplied to the tube through pipe A, the compressed air may be primarily introduced into a vortex rotating chamber and then may begin to rotate. A primary vortex B may be toward a hot air outlet, the hot air may be discharged by an adjusting valve D, and the remaining air returns to form a secondary vortex C and may be discharged to a cold air outlet E. The two rotating vortexes B and C may rotate in the same direction, and therefore due to a difference in rotating speed between an inside and an exterior thereof, a temperature of the exterior may be substantially high and a temperature of the inside thereof may be substantially low (e.g., the temperatures may be substantially different or a maximum and a minimum). A flow rate and a temperature of cold air and hot air may be changed based on a pressure and a temperature of the compressed air. Further, the rotating speed of the compressed air may be different based on a shape of the vortex rotating chamber within the vortex tube 30 and a size of the hot air/cold air outlet and the rotating speed may become a factor of determining a temperature difference between cold air and hot air separated in the vortex tube.

The controller 50 may be configured to receive information regarding a pressure and the compressed air quantity from the air compressor 10. Further, the controller 50 may be configured to adjust an operational amount and an operational time of the valve 20 based on the information on the pressure and the received compressed air quantity and a state of charge received from the battery 70.

The muffler 60 is illustrated in FIG. 4 and may be configured to collect the air discharged from the channel 41 formed at the first side and the channel 43 formed at the second side, thereby attenuating noise which may occur when the collected compressed air is discharged into the atmosphere. As illustrated in FIG. 4, the muffler 60 may include a filter and may have a circular cross section. An amount of noise attenuated based on the filter of the muffler 60 and a length of the muffler 60 may be different.

Although the present invention has been described with reference to exemplary embodiments shown in the accompanying drawings, it is only an example. It will be understood by those skilled in the art that various modifications and equivalent other exemplary embodiments are possible from the present invention. Accordingly, an actual technical protection scope of the present invention is to be defined by the following claims.

What is claimed is:

1. A thermoelectric power generation system for a vehicle, comprising:
   an air compressor configured to compress and discharge air;
   an air tank configured to store the compressed air discharged from the air compressor via an air drier;
   a vortex tube configured to receive the compressed air discharged from the air compressor and stored in the air tank and separate and discharge the compressed air into two groups of air having a temperature difference;
   a thermoelectric module that includes a thermoelectric element having a channel formed at a first side thereof introduced with a first group of the two groups of air and a channel formed at a second side thereof introduced with a second group of the two groups of air to generate an electromotive force due to the temperature difference of the two groups of air; and
   a valve disposed between the air compressor and the vortex tube,
   wherein a controller is configured to adjust an operation amount and an operation time of the valve based on information regarding a pressure of the compressed air and a compressed air quantity received from the air compressor and a state of charge from a battery.

2. The thermoelectric power generation system for a vehicle of claim 1, wherein the
   a battery is connected to the thermoelectric element to store the electromotive force generated from the thermoelectric element.

3. The thermoelectric power generation system for a vehicle of claim 1, further comprising:
   a muffler connected to the thermoelectric module to accommodate air discharged from the channels to attenuate noise and discharge the attenuated noise to the exterior.

4. The thermoelectric power generation system for a vehicle of claim 1, wherein the compressed air stored in the air tank is supplied to an air brake system, an air suspension system, and the vortex tube.

\* \* \* \* \*